(12) United States Patent
Bhuwalka et al.

(10) Patent No.: US 7,834,345 B2
(45) Date of Patent: Nov. 16, 2010

(54) TUNNEL FIELD-EFFECT TRANSISTORS WITH SUPERLATTICE CHANNELS

(75) Inventors: Krishna Kumar Bhuwalka, Hsin-Chu (TW); Ching-Ya Wang, Taipei (TW); Ken-Ichi Goto, Hsin-Chu (TW); Wen-Chin Lee, Hsin-Chu (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 160 days.

(21) Appl. No.: 12/205,585

(22) Filed: Sep. 5, 2008

(65) Prior Publication Data

US 2010/0059737 A1    Mar. 11, 2010

(51) Int. Cl.
*H01L 29/94* (2006.01)

(52) U.S. Cl. .................. 257/28; 257/288; 257/E29.068; 257/E29.073

(58) Field of Classification Search .................... 257/28, 257/288, 345, E29.007, E29.068, E29.072, 257/E29.073
See application file for complete search history.

(56) References Cited

U.S. PATENT DOCUMENTS

| | | | |
|---|---|---|---|
| 4,934,204 A | 6/1990 | Hadden, Sr. |
| 5,683,934 A | 11/1997 | Candelaria |
| 5,686,739 A | 11/1997 | Baba |
| 5,705,827 A | 1/1998 | Baba et al. |
| 6,472,685 B2 | 10/2002 | Takagi |
| 6,897,472 B2 | 5/2005 | Mears et al. |
| 2003/0057416 A1 | 3/2003 | Currie et al. |
| 2005/0017275 A1 | 1/2005 | Chau et al. |
| 2006/0091490 A1 | 5/2006 | Chen et al. |
| 2006/0258072 A1 | 11/2006 | Kavalieros et al. |
| 2008/0050881 A1 | 2/2008 | Chen et al. |
| 2008/0067607 A1 | 3/2008 | Verhulst et al. |

FOREIGN PATENT DOCUMENTS

| | | |
|---|---|---|
| CN | 1357926 A | 7/2002 |
| JP | 61121370 A | 6/1986 |

OTHER PUBLICATIONS

Appenzeller, J., et al., "Comparing Carbon Nanotube Transistors—The Ideal Choice: A Novel Tunneling Device Design," IEEE Transactions on Electronic Devices, vol. 52, No. 12, Dec. 2005, pp. 2568-2576.

Bhuwalka, K. K., et al., "Vertical Tunnel Field-Effect Transistor," IEEE Transactions on Electron Devices, vol. 51, No. 2, Feb. 2004, pp. 279-282.

(Continued)

*Primary Examiner*—Matthew E Warren
(74) *Attorney, Agent, or Firm*—Slater & Matsil, L.L.P.

(57) ABSTRACT

A semiconductor device includes a channel region; a gate dielectric over the channel region; a gate electrode over the gate dielectric; and a first source/drain region adjacent the gate dielectric. The first source/drain region is of a first conductivity type. At least one of the channel region and the first source/drain region includes a superlattice structure. The semiconductor device further includes a second source/drain region on an opposite side of the channel region than the first source/drain region. The second source/drain region is of a second conductivity type opposite the first conductivity type. At most, one of the first source/drain region and the second source/drain region comprises an additional superlattice structure.

20 Claims, 15 Drawing Sheets

OTHER PUBLICATIONS

Boucart, K., et al., "Double-Gate Tunnel FET with High-κ Gate Dielectric," IEEE Transactions on Electron Devices, vol. 54, No. 7, Jul. 2007, pp. 1725-1733.

Aydin, C., et al., "Lateral Interband Tunneling Transistor in Silicon-on-Insulator," Applied Physics Letters, Mar. 8, 2004, pp. 1780-1782, vol. 84, No. 10, American Institute of Physics.

Baba, T., "Proposal for Surface Tunnel Transistors," Japanese Journal of Applied Physics, Apr. 15, 1992, pp. L455-L457, vol. 32, Part 2, No. 4B, The Japan Society of Applied Physics.

Bhuwalka, K., et al., "Performance Enhancement of Vertical Tunnel Field-Effect Transistor with SiGe in the delta-$p^+$ Layer," Japanese Journal of Applied Physics, 2004, pp. 4073-4078, vol. 43, No. 7A, The Japan Society of Applied Physics.

Bhuwalka, K., et al., "P-Channel Tunnel Field-Effect Transistors Down to Sub-50 nm Channel Lengths," Japanese Journal of Applied Physics, 2006, pp. 3106-3109, vol. 45, No. 4B, The Japan Society of Applied Physics.

Gopalakrishnan, K., et al., "I-MOS: A Novel Semiconductor Device with a Subthreshold Slope Lower than kT/q," International Electron Devices Meeting, 2002, pp. 289-292, IEEE.

Koga, J., et al., "Three-Terminal Silicon Surface Junction Tunneling Device for Room Temperature Operation," IEEE Electron Device Letters, Oct. 1999, pp. 529-531, vol. 20, No. 10, IEEE.

Mears, R., et al., "Silicon Superlattice on SOI for High Mobility and Reduced Leakage," IEEE International SOI Conference Proceedings, 2007, pp. 23-24, IEEE.

Reddick, W., et al., "Silicon Surface Tunnel Transistor," Applied Physics Letters, Jul. 24, 1995, pp. 494-496, vol. 67, No. 4, American Institute of Physics.

Seo, Y.-J., et al., "Transport Through a Nine Period Silicon/Oxygen Superlattice," Applied Physics Letters, Aug. 6, 2001, pp. 788-790, vol. 79, No. 6, American Institute of Physics.

Seo, Y.-J., et al., "Electronic and Optical Characteristics of Multilayer Nanocrystalline Silicon/Absorbed Oxygen Superlattice," Aug. 2001, pp. 4799-4801, vol. 40, Part 1, No. 8, The Japan Society of Applied Physics.

Tateshita, Y., et al., "High-Performance and Low-Power CMOS Device Technologies Featuring Metal/High-k Gate Stacks with Uniaxial Strained Silicon Channels on (100) and (110) Substrates," International Electron Devices Meeting, 2006, 4 pp., IEEE.

Tsu, R., et al., "Silicon Epitaxy on Si(100) with Absorbed Oxygen," Electrochemical and Solid-State Letters, 1998, pp. 80-82, vol. 1, No. 2, The Electrochemical Society, Inc.

TUNNEL FIELD-EFFECT TRANSISTORS WITH SUPERLATTICE CHANNELS

CROSS-REFERENCE TO RELATED APPLICATION

This application relates to commonly assigned U.S. patent application Ser. No. 11/828,211, filed Jul. 25, 2007, and entitled "Tunnel Field-Effect Transistor with Narrow Band-Gap Channel and Strong Gate Coupling" which application is hereby incorporated herein by reference.

TECHNICAL FIELD

This invention relates generally to semiconductor devices, and more specifically to tunnel field-effect transistors (FETs) having superlattice channels.

BACKGROUND

Metal-oxide-semiconductor (MOS) is a dominating technology for integrated circuits at 90 nm technology and beyond. A MOS device can work in three regions, depending on gate voltage Vg and source-drain voltage Vds, linear, saturation, and sub-threshold regions. The sub-threshold region is a region where the gate voltage Vg is smaller than the threshold voltage Vt. The sub-threshold swing represents the easiness of switching the transistor current off and thus is an important factor in determining the speed and power of a MOS device. The sub-threshold swing can be expressed as a function of $m*kT/q$, where m is a parameter related to capacitance. The sub-threshold swing of a conventional MOS device has a limit of about 60 mV/decade (kT/q) at room temperature, which in turn sets a limit for further scaling of operation voltage VDD and threshold voltage Vt. This limitation is due to the drift-diffusion transport mechanism of carriers. For this reason, existing MOS devices typically cannot switch faster than 60 mV/decade at room temperature. The 60 mV/decade sub-threshold swing limit also applies to FinFET or ultra thin-body MOSFET on silicon-on-insulator (SOI) devices. However, even with better gate control over the channel, an ultra thin-body MOSFET on SOI or FinFET device can only achieve close to, but not below, the limit of 60 mV/decade. With such a limit, faster switching at low operation voltages for future nanometer devices cannot be achieved.

To solve the above-discussed problem, tunnel field-effect transistors (FETs) have been explored. FIG. 1A illustrates a conventional FET device with gate dielectric 166, gate electrode 168, a heavily doped p-type drain region 164, and a heavily doped n-type source region 162. Drain region 164 is formed by implanting a p-type impurity, while source region 162 is formed by recessing the substrate 163, and epitaxially growing a semiconductor material, followed by doping the semiconductor material with an n-type impurity.

FIG. 1B illustrates an asymmetric tunnel FET device, which includes a heavily doped drain region 202 and a heavily doped source region 204 separated by channel region 203. Drain region 202 comprises silicon, while source region 204 comprises silicon germanium. Channel region 203 is formed of intrinsic silicon. Gate 208 controls channel region 203. The tunnel FET device shown in FIG. 1B has a kT/q independent sub-threshold swing and a low off-state current. However, such a structure can only improve the on-currents of n-channel tunnel FET devices, while the on-currents of p-channel tunnel FET devices are not improved.

The above-mentioned tunnel FET devices suffer from drawbacks. First, they still suffer from gate leakage currents. The gate leakage currents, which are portions of the off-currents of the respective tunnel FETs, limit the further reduction in off-currents when integrated circuits are scaled down. Further, the on-currents of the tunnel FETs are still not high enough to meet demanding technology requirements.

Therefore, the existing tunnel FETs are not suitable for being used in applications requiring very low power consumption and very high speed, such as mobile applications. What is needed in the art, therefore, is a method for further improving the on-currents and reducing leakage currents of MOSFETs.

SUMMARY OF THE INVENTION

In accordance with one aspect of the present invention, a semiconductor device includes a channel region; a gate dielectric over the channel region; a gate electrode over the gate dielectric; and a first source/drain region adjacent the gate dielectric. The first source/drain region is of a first conductivity type. At least one of the channel region and the first source/drain region comprises a superlattice structure. The semiconductor device further includes a second source/drain region on an opposite side of the channel region than the first source/drain region. The second source/drain region is of a second conductivity type opposite the first conductivity type. At most, one of the first source/drain region and the second source/drain region comprises an additional superlattice structure.

In accordance with another aspect of the present invention, a semiconductor device includes a superlattice channel region formed of a semiconductor material; a gate dielectric on the superlattice channel region; a gate electrode over the gate dielectric; a first source/drain region adjacent the gate dielectric, wherein the first source/drain region is of a first conductivity type; and a second source/drain region adjacent the gate dielectric. The second source/drain region is of a second conductivity type opposite the first conductivity type. The superlattice channel region is located between the first and the second source/drain regions.

In accordance with yet another aspect of the present invention, a semiconductor device includes a channel region having a non-superlattice structure; a gate dielectric over the channel region; a gate electrode over the gate dielectric; a source region having a superlattice structure adjacent the gate dielectric, wherein the source region is of a first conductivity type; and a drain region adjacent the gate dielectric. The drain region is of a second conductivity type opposite the first conductivity type and has a non-superlattice structure. The channel region is between the source region and the drain region.

In accordance with yet another aspect of the present invention, a semiconductor device includes a semiconductor substrate and a superlattice channel region over the semiconductor substrate. The superlattice channel region includes a first base semiconductor layer; a second base semiconductor layer over the first base semiconductor layer; and a non-semiconductor monolayer between the first and the second base semiconductor layers. The semiconductor device includes a gate dielectric over the superlattice channel region; a gate electrode over the gate dielectric; and a first and a second source/drain region on opposing sides of, and adjoining, the superlattice channel region. The first and the second source/drain regions are of opposite conductivity types.

In accordance with yet another aspect of the present invention, a semiconductor device includes a semiconductor substrate; a superlattice channel region over the semiconductor substrate; a gate dielectric over the superlattice channel region; a gate electrode over the gate dielectric; a pair of spacers on opposing sidewalls of the gate electrode; a first and a second source/drain region on opposing sides of the superlattice channel region, wherein the first and the second source/drain regions are of opposite conductivity types; a first source/drain extension region between and adjoining the superlattice channel region and the first source/drain region, wherein the first source/drain extension region is of a same conductivity type as the first source/drain region; and a second source/drain extension region between and adjoining the superlattice channel region and the second source/drain region. The second source/drain extension region is of a same conductivity type as the second source/drain region. The first and the second source/drain extension regions are at least moderately doped.

In accordance with yet another aspect of the present invention, a method for forming a semiconductor device includes forming a superlattice channel region; forming a gate dielectric on the superlattice channel region; forming a gate electrode over the gate dielectric; forming a first source/drain region adjacent the gate dielectric, wherein the first source/drain region is of a first conductivity type; and forming a second source/drain region adjacent the gate dielectric and on an opposing side of the gate electrode than the first source/drain region, wherein the second source/drain region is of a second conductivity type opposite the first conductivity type.

In accordance with yet another aspect of the present invention, a method for forming a semiconductor device includes providing a semiconductor substrate; forming superlattice layers over the semiconductor substrate; forming a dummy gate stack over the superlattice layers; and implanting portions of a superlattice channel region unmasked by the dummy gate stack. The portions of the superlattice layers on opposite sides of the dummy gate stack are at least moderately implanted with impurities having opposite conductivity types. The method further includes forming gate spacers on sidewalls of the dummy gate stack after the step of implanting; using the dummy gate stack and the gate spacers as a mask to recess the superlattice layers to form recesses; filling the recesses with a semiconductor material to form a first and a second semiconductor region; implanting the first and the second semiconductor regions with impurities having opposite conductivity types; removing the dummy gate stack; forming a gate dielectric layer and a gate electrode layer in a space left by the dummy gate stack; and performing a chemical mechanical polish, wherein remaining portions of the gate dielectric layer and the gate electrode layer form a gate dielectric and a gate electrode, respectively.

In accordance with yet another aspect of the present invention, a method for forming a semiconductor device includes providing a semiconductor substrate; forming superlattice layers over the semiconductor substrate; forming a dummy gate stack over the superlattice layers; forming gate spacers on sidewalls of the dummy gate stack; using the dummy gate stack and the gate spacers as a mask, recessing the superlattice layers to form recesses; filling the recesses with a semiconductor material to form a first and a second semiconductor region; performing a first and a second implantation substantially vertically to implant the first and the second semiconductor regions with impurities having the first and the second conductivity types, respectively; tilt performing a third and a fourth implantation to form a first and a second source/drain extension region adjoining the first and the second semiconductor regions, respectively, wherein the first and the second source/drain extension regions are at least moderately doped and have same conductivity types as the first and the second semiconductor regions, respectively; removing the dummy gate stack; forming a gate dielectric layer and a gate electrode layer in a space left by the dummy gate stack; and performing a chemical mechanical polish, wherein remaining portions of the gate dielectric layer and the gate electrode layer form a gate dielectric and a gate electrode, respectively.

The advantageous features of the present invention include improved on-currents without sacrificing source-drain leakage current as well as reduced gate leakage currents.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Novel tunnel field-effect transistors (FETs) formed of gated p-i-n diodes with superlattice channels and methods for forming the same are provided. The intermediate stages of manufacturing preferred embodiments of the present invention are illustrated. The variations of the preferred embodiments are then discussed. Throughout the various views and illustrative embodiments of the present invention, like reference numbers are used to designate like elements.

Figure 1A:
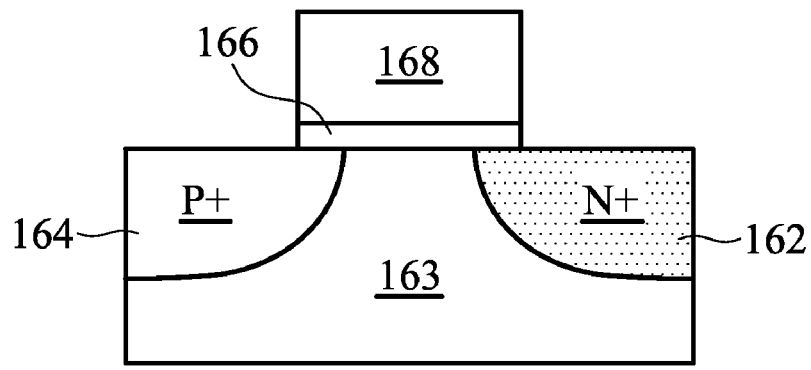
FIGS. 1A and 1B illustrate conventional tunnel field effect transistor (FET) devices.
Figure 1B:
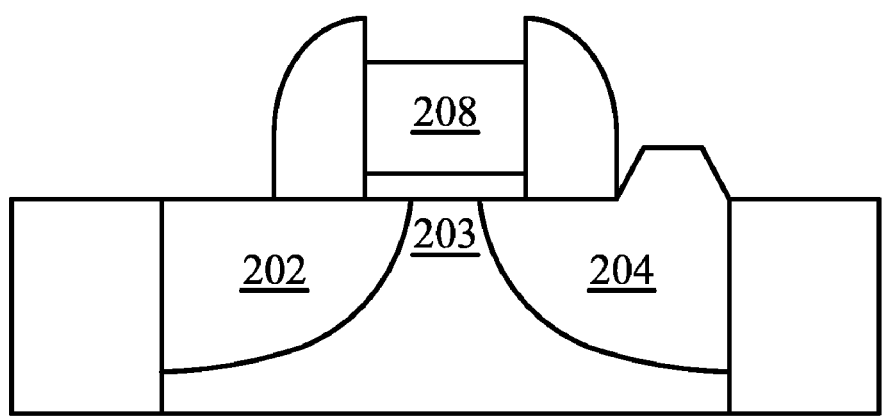
Figure 2:
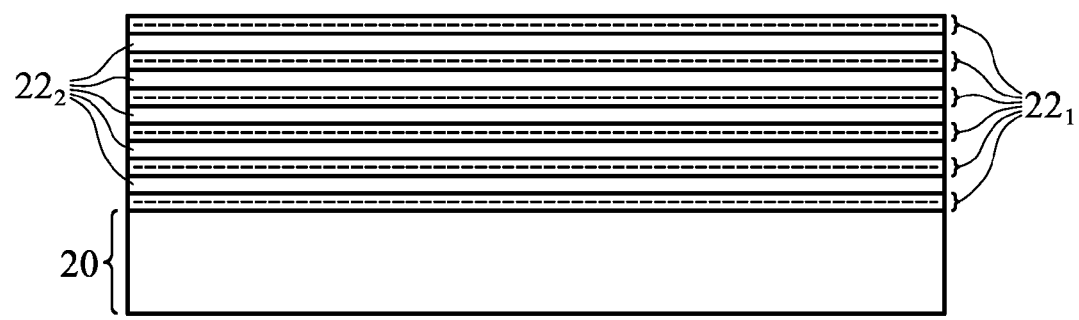
FIGS. 2 through 9 are cross-sectional views of intermediate stages in the manufacturing of a first embodiment of the present invention, wherein source and drain regions are formed by implanting superlattice layers.

A first embodiment of the present invention is provided in FIGS. 2 through 9. Referring to FIG. 2, substrate 20 is provided. In an embodiment, substrate 20 is a bulk substrate comprising a single crystalline semiconductor material, such as silicon, or a compound semiconductor material such as silicon germanium. In other embodiments, substrate 20 may include more than one semiconductor layer. For example, substrate 20 may have a silicon-on-insulator or silicon-on-carbide structure.

Superlattice layers 22 are formed over substrate 20. In the preferred embodiment, superlattice layers 22 include a sandwich structure with semiconductor layer(s) and non-semiconductor (and non-metal) monolayer(s) allocated in an alternating pattern. In the exemplary embodiment as shown in FIG. 2, the semiconductor layer(s) are denoted as $22_1$, and are alternatively referred to as base semiconductor layers $22_1$. The non-semiconductor monolayer(s) are denoted as $22_2$, and are alternatively referred to as energy-band modifying layer(s) $22_2$.

Each of base semiconductor layers $22_1$ may comprise a base semiconductor selected from commonly used semiconductor materials such as silicon, silicon germanium, gallium arsenide, and/or other group III, IV, and V elements. Between the overlying and underlying energy-band modifying layer(s) $22_2$, there may be a monolayer of semiconductor, or a plurality of bonded semiconductor monolayers, which in combination form a base semiconductor layer $22_1$. Each of the energy-band modifying layers $22_2$ may be formed of a monolayer of oxygen, or a monolayer of other non-semiconductor (and non-metal) material such as oxygen, nitrogen, fluorine, carbon-oxygen, or the like. Energy-band modifying layers $22_2$ are preferably tightly bonded to the overlying and underlying semiconductor layers $22_1$ to form superlattice (such as Si/O superlattice) structures. In the preferred embodiment, only one monolayer $22_2$ exists between the overlying and the underlying base semiconductor layers $22_1$. However, there can be two, three, or four layers of the energy-band modifying layers $22_2$ bonded together. This is partially due to the difficulty in the control of the formation of the energy-band modifying monolayer $22_2$. However, the number of energy-band modifying layers $22_2$ that adjoin each other is preferably as small as possible.

In the embodiment wherein the top layer of substrate 20 includes a crystalline semiconductor material, an epitaxial growth may be performed to grow superlattice layers 22 on substrate 20, and the method of deposition is preferably atomic layer deposition (ALD), although other methods can also be used. Superlattice layers 22 are preferably intrinsic. In an embodiment, superlattice layers 22 are un-doped. Alternatively, superlattice layers 22 are lightly doped to a concentration of less than, for example, about $1E15/cm^3$. The total thickness of superlattice layers 22 is preferably greater than the desirable channel depth of the resulting tunnel FET, for example, greater than about 3 nm. In an exemplary embodiment, the number of the alternating base semiconductor layers $22_1$ or energy-band modifying layers $22_2$ is greater than about 5 nm.

Figure 3:
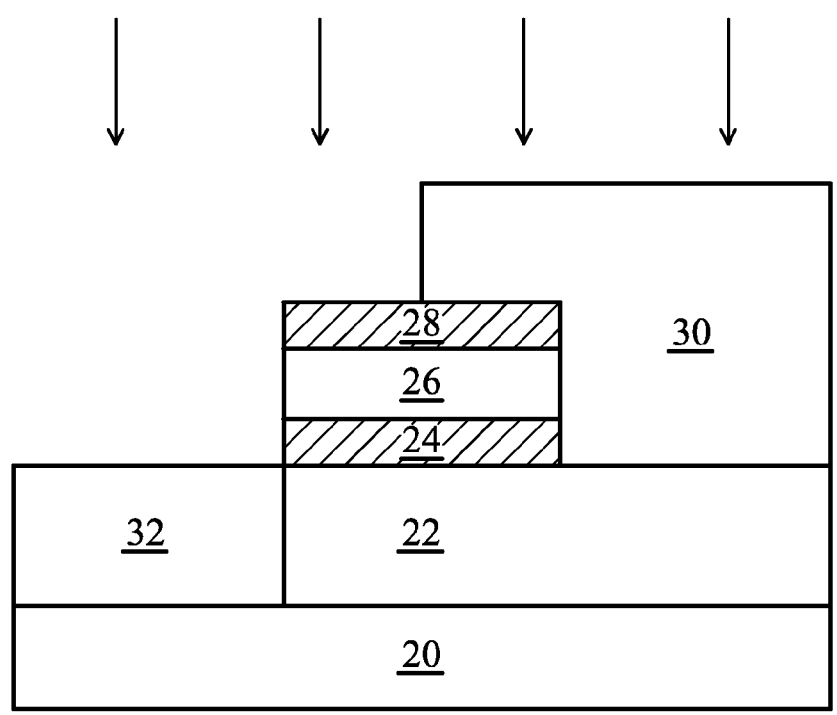

FIG. 3 illustrates the formation of a dummy gate stack, which includes dummy gate dielectric 24, dummy gate electrode 26, and dummy gate mask 28. As is known in the art, the formation of the dummy gate stack includes forming a gate dielectric layer, forming a gate electrode layer on the gate dielectric layer, forming a gate mask layer on the gate electrode layer, and patterning the stacked layers. Photo resist 30 is then applied and patterned, followed by an implantation to dope an n-type impurity, which may include phosphorous, arsenic, and combinations thereof. The implantation may be vertically performed, or tilted toward the dummy gate stack. As a result, drain region 32 is formed. Drain region 32 may be substantially aligned to the edge of the dummy gate stack, or extend under the dummy gate stack if the implantation is tilted. Photo resist 30 is then removed. It is noted that after the implantation to form drain region 32 (and source region 36, as shown in FIG. 4), drain region 32 and source region 36 may no longer have the superlattice structure, although they still contain the elements of the energy-band modifying monolayers $22_2$.

Figure 4:
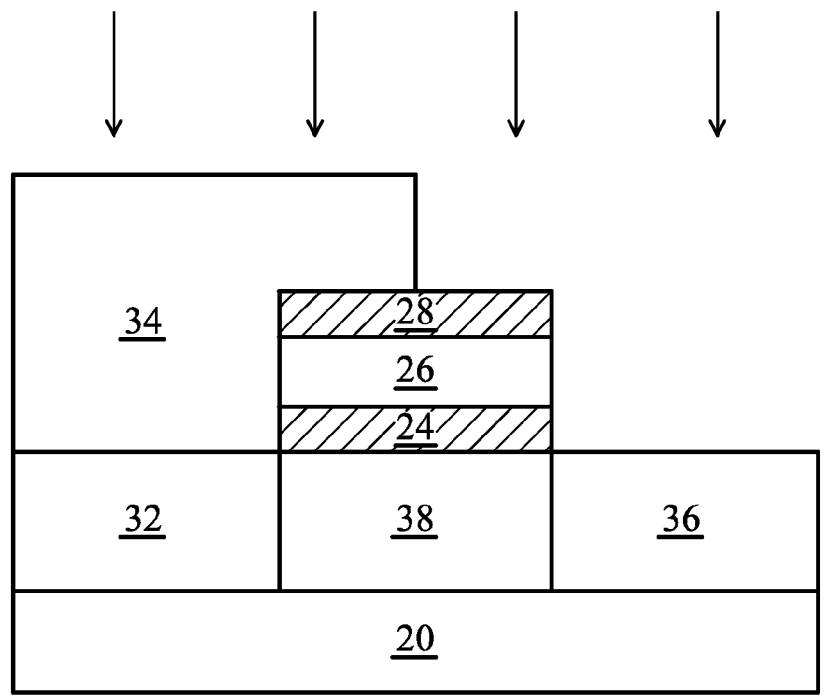

Referring to FIG. 4, photo resist 34 is applied and patterned, covering drain region 32 and a portion of the dummy gate stack. An implantation is then performed to dope a p-type impurity, such as boron, indium, and combinations thereof. Again, the implantation may be vertically performed, or tilted toward the dummy gate stack. As a result, source region 36 is formed. Similarly, source region 36 may be substantially aligned to the edge of the dummy gate stack, or extend under the dummy gate stack if the implantation is tilted. Superlattice channel region 38 will be formed in an un-implanted region between drain region 32 and source region 36.

In an embodiment, both drain region 32 and source region 36 are heavily doped, and thus drain region 32 is referred to as an n+ region, while source region 36 is referred to as a p+ region. In the described embodiments, "heavily doped" means an impurity concentration of greater than about $1020/cm^3$. One skilled in the art will recognize, however, that "heavily doped" is a term of art that depends upon the specific device type, technology generation, minimum feature size, and the like. It is intended, therefore, that the term be interpreted in light of the technology being evaluated and not be limited to the described embodiments. The resulting tunnel FET device will be an ambipolar FET device, which means that the tunnel FET device can be either an n-channel device or a p-channel device, depending on whether the gate voltage is positive or negative, respectively.

In alternative embodiments, one of the drain region 32 and source region 36 is heavily doped, while the other is moderately doped (referred to as an n region or a p region, depending on the impurity type). The term "moderately doped" indicates an impurity concentration of lower than "heavily doped," for example, between about $10^{18}/cm^3$ and about $1020/cm3$. If drain region 32 is an n region, and source region 36 is a p+ region, the resulting tunnel FET will be an n-channel FET, and will be turned on by a positive gate voltage. Conversely, if drain region 32 is an n+ region, and source region 36 is a p region, the resulting tunnel FET will be a p-channel FET, and will be turned on by a negative gate voltage.

Figure 5:
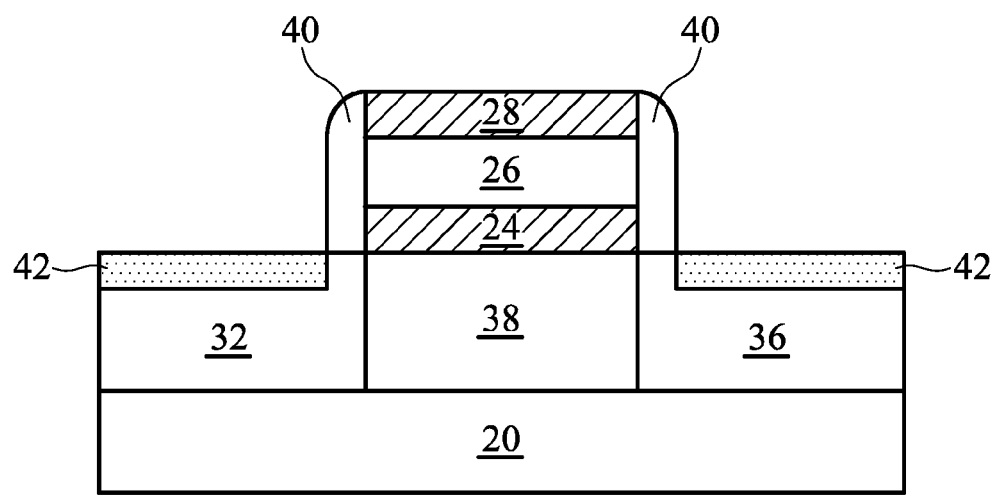

FIG. 5 illustrates the formation of gate spacers 40 and source/drain silicide regions 42. As is known in the art, the formation of gate spacers 40 may include forming a gate dielectric layer, and etching the gate dielectric layer to remove horizontal portions. Source/drain silicide regions 42 may be formed by blanket forming a metal layer, and performing an annealing to cause a reaction between the metal layer and the underlying silicon. The un-reacted metal is then removed.

Figure 6:
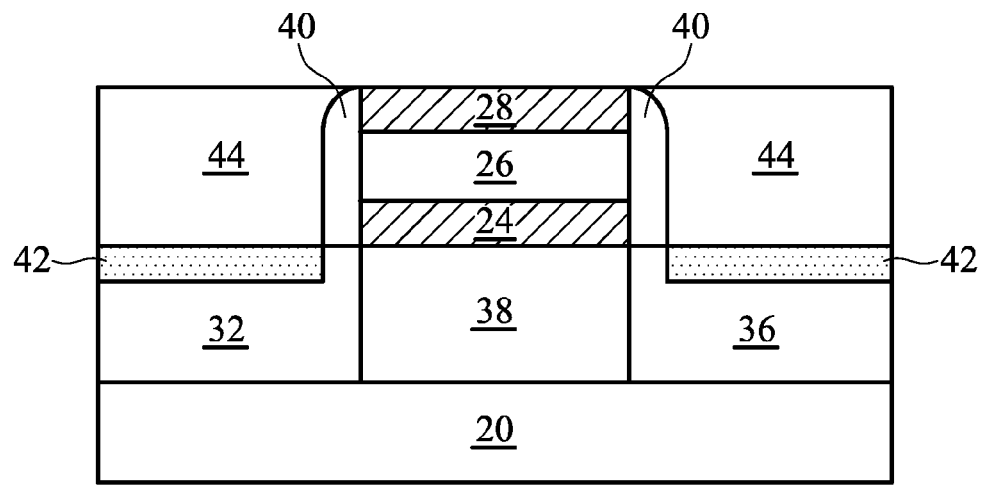

Referring to FIG. 6, a first inter-layer dielectric (ILD) 44 is formed, followed by a chemical mechanical polish (CMP) to level the top surface of ILD 44 to the top surface of dummy gate mask 28. ILD 44 may include commonly used ILD materials, such as boronphosphosilicate glass (BPSG). Other elements such as carbon, nitrogen, oxygen, and combinations thereof may also be included.

Figure 7:
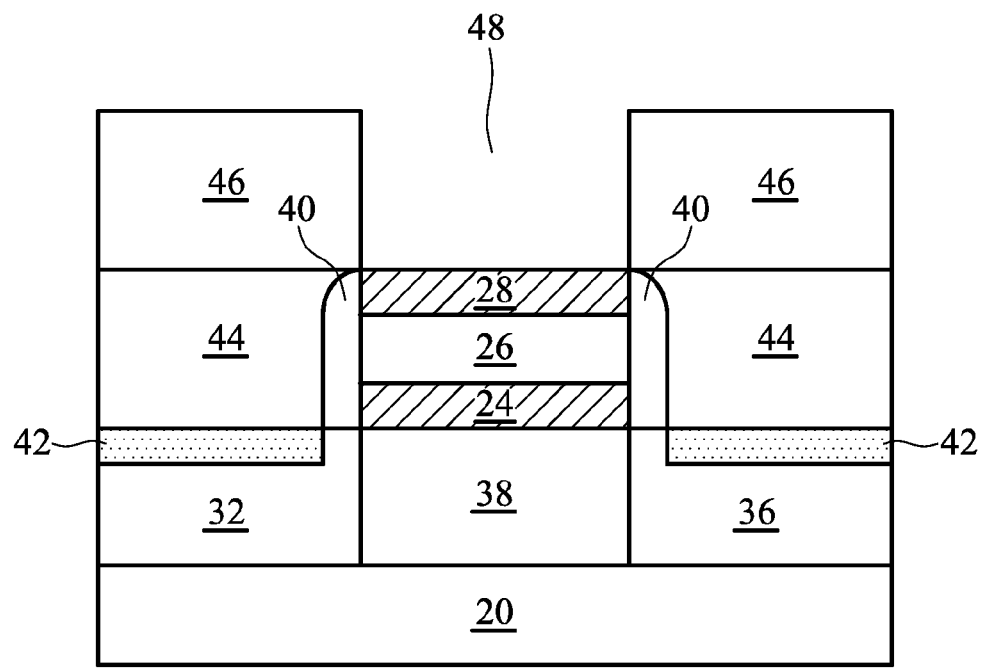
Figure 8:
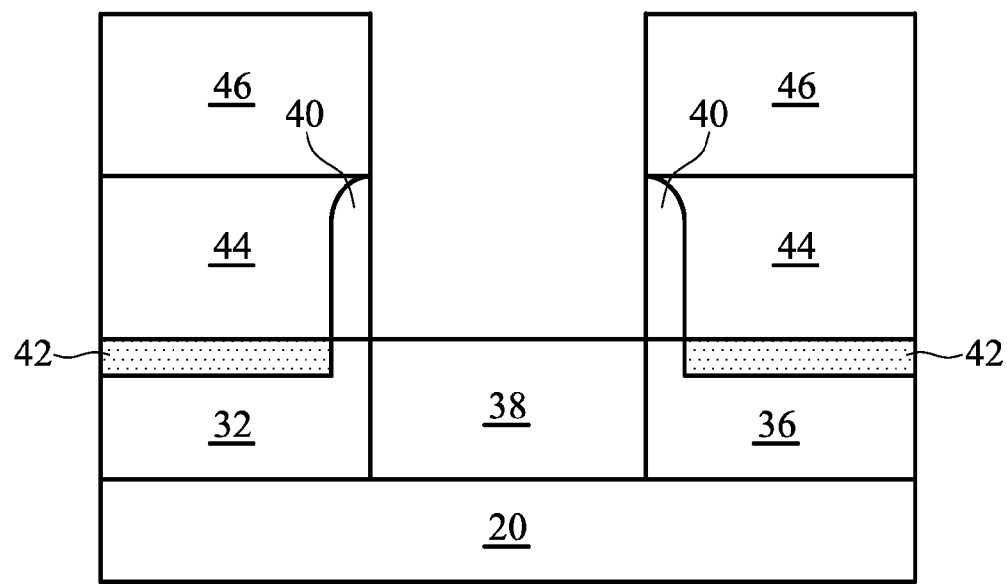

In FIG. 7, photo resist 46 is applied and patterned, forming opening 48, through which dummy gate mask 28 is exposed. Next, as is shown in FIG. 8, the dummy gate stack is removed, preferably by etching, exposing superlattice channel region 38.

Figure 9:
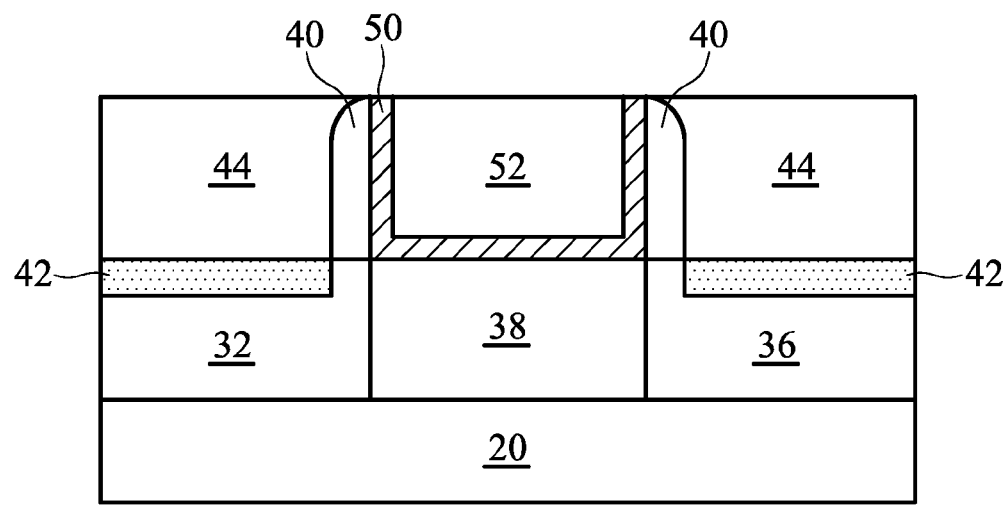

Referring to FIG. 9, gate dielectric 50 and gate electrode 52 are formed. The formation process may include forming a gate dielectric layer, forming a gate electrode layer, and performing a CMP to remove excess materials. In the preferred embodiment, gate dielectric 50 includes a high-k dielectric with a preferred k value between about 7 and about 60. The preferred materials of gate dielectric 50 may include high-k metal oxides such as $HfO_2$, silicon nitride, silicon oxide, silicon oxynitride, and combinations thereof. Gate dielectric 50 may also have a composite structure including more than one layer. Gate electrode 52 may include doped polysilicon, metals, metal silicides, multi-layers thereof, and combinations thereof. Next, an additional ILD is formed (not shown), and contact plugs are formed (not shown) in the additional ILD and ILD 44 to contact with gate electrode 52 and source/drain silicide regions 42.

Figure 10:
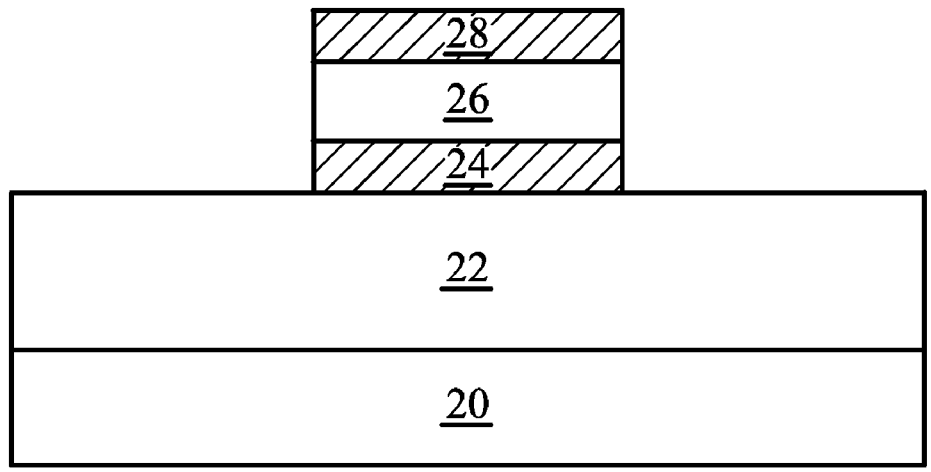
FIGS. 10 through 16 are cross-sectional views of intermediate stages in the manufacturing of a second embodiment of the present invention, wherein at least moderately doped source/drain extension regions are formed adjacent to superlattice layers.
Figure 11:
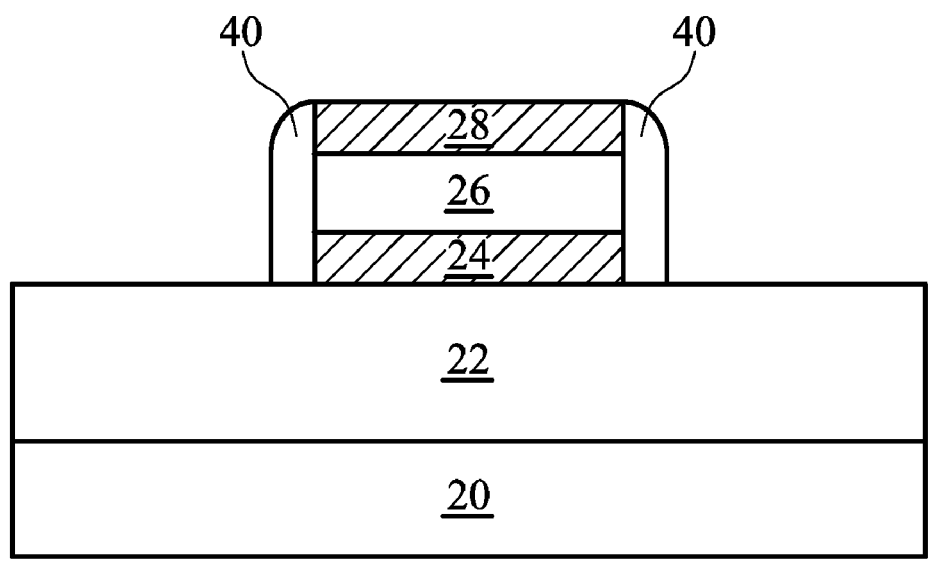
Figure 12:
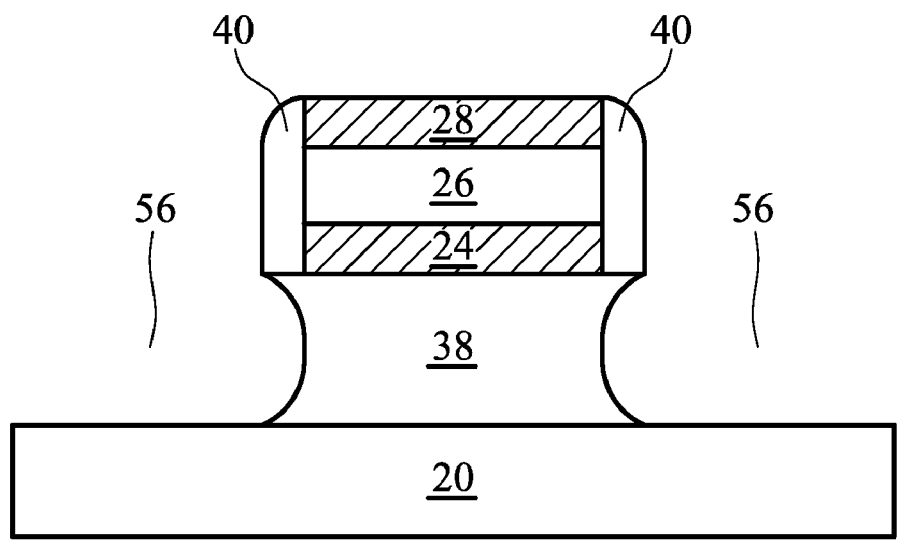
Figure 13:
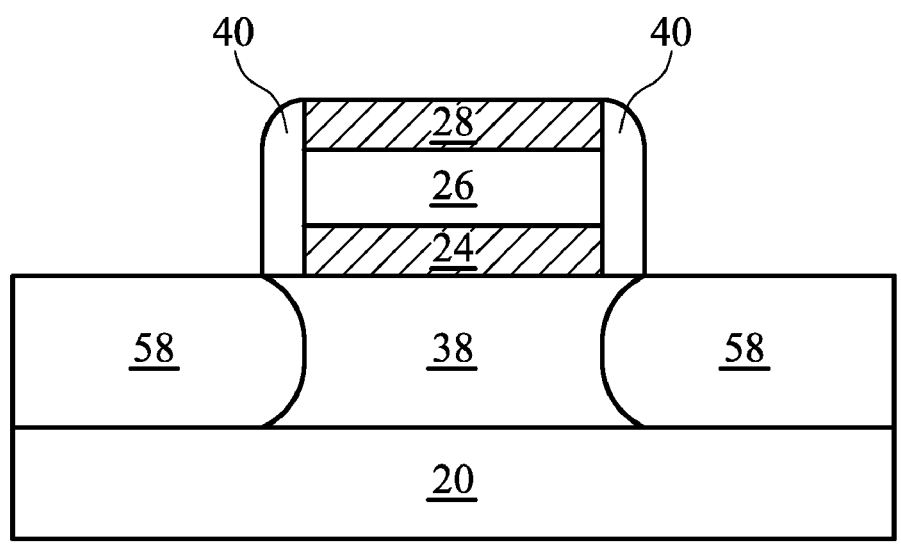

FIGS. 10 through 16 illustrate a second embodiment of the present invention. Referring to FIG. 10, superlattice layers 22 are formed on substrate 20, wherein the formation process may be essentially the same as in the first embodiment. A dummy gate stack including dummy gate dielectric 24, dummy gate electrode 26, and dummy mask 28 is then formed. Next, gate spacers 40 are formed, as is shown in FIG. 11. FIG. 12 illustrates the recessing of superlattice layers 22, wherein the recessing is preferably isotropic, so that the resulting recesses 56 may extend under gate spacers 40. Alternatively, the recessing is anisotropic. The recessing method may include plasma etching, or performing an implantation to amorphize portions of substrate 20, and then removing the amorphized portions. A remaining portion of superlattice layers 22 is denoted as superlattice region 38, which will form the superlattice channel region. Recesses 56 are then filled with epitaxially grown silicon germanium, forming silicon regions 58, as is shown in FIG. 13. In alternative embodiments, recesses 56 are filled with silicon.

Figure 14:
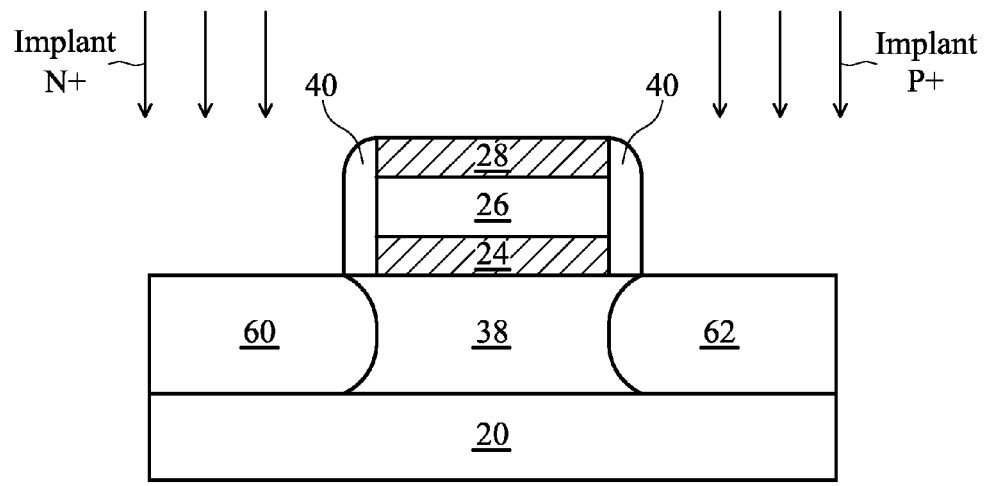

Referring to FIG. 14, n+ drain region 60 and p+ source region 62 are formed. To form n+ drain region 60, a first photo resist (not shown) is formed and patterned, covering a half of the illustrated structure, and an implantation is performed to introduce an n-type impurity, forming n+ drain region 60. The first photo resist is then removed, and a second photo resist is formed to cover the other half of the illustrated structure. An implantation is then performed to introduce a p-type impurity, forming p+ source region 62. The second photo resist is then removed. Preferably, the implantations are substantially vertical.

Figure 15:
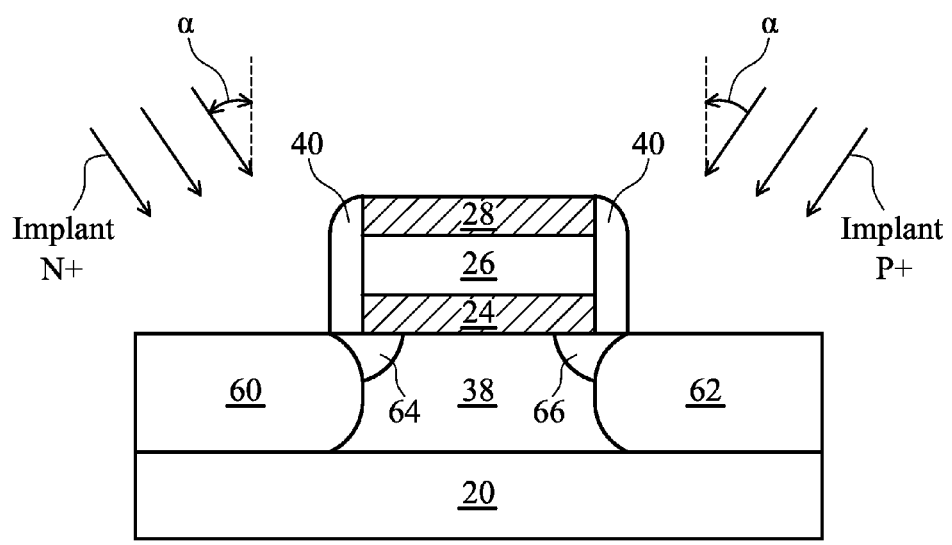
Figure 16:
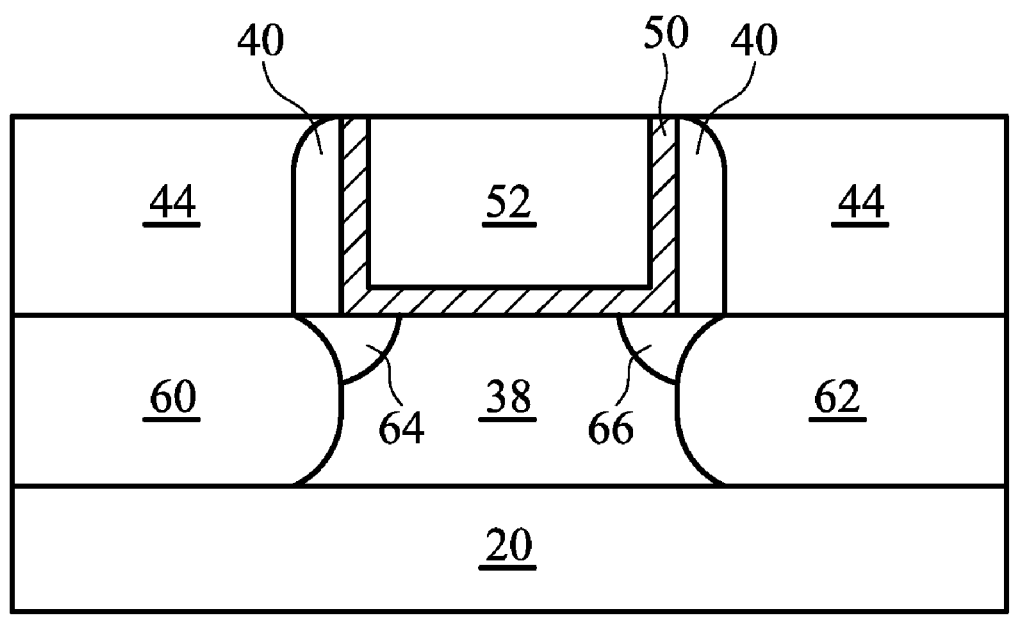

FIG. 15 illustrates the formation of n+ drain extension region 64 and p+ source extension region 66. To form n+ drain extension region 64, a photo resist is formed (not shown) and patterned. A tilt implantation, which tilts at angle toward the dummy gate stack, is then performed. The implantation energy is preferably less than the energy used for implanting n+ drain region 60. The photo resist is then removed. Accordingly, the depth of n+ drain extension region 64 is smaller then the depth of n+ drain region 60. Similarly, p+ source extension region 66 is also formed using essentially the same tilt implantation process as n+ drain region 60. Referring again to FIG. 16, ILD 44, gate dielectric 50, and gate electrode 52, which are preferably essentially the same as in the first embodiment, are formed.

Figure 17:
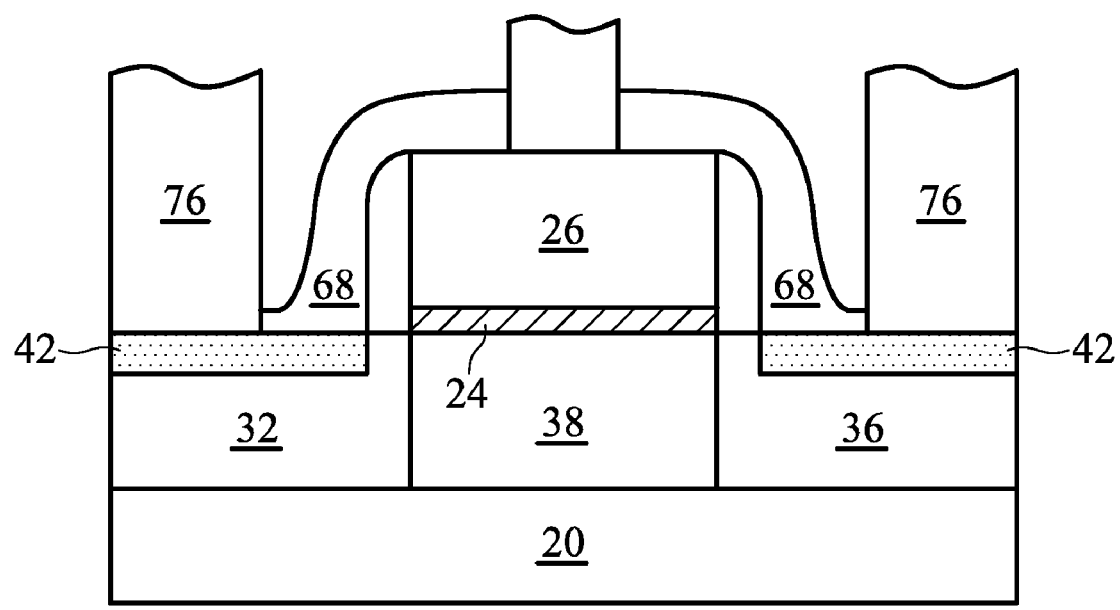
FIG. 17 illustrates an embodiment of the present invention having a gate-first structure, wherein a stressed contact etch stop layer is formed.

In the embodiments discussed in the preceding paragraphs, the left sides of the structures are referred to as drain sides and the right sides are referred to as source sides. One skilled in the art will realize that the source and drain sides are interchangeable, providing appropriate voltages are applied. In addition, although the first and the second embodiments use gate-last approaches, wherein the respective gate dielectrics and gate electrodes are formed after the formation of source/drain regions by replacing dummy gate stacks, one skilled in the art will realize that a gate-first approach may also be used. FIG. 17 illustrates an exemplary tunnel FET device with a gate-first structure. Contacts 76 are electrically connected to drain region 32 and source region 36. Contact etch stop layer 68 is formed over drain region 32, source region 36, and gate electrode 26.

Figure 18:
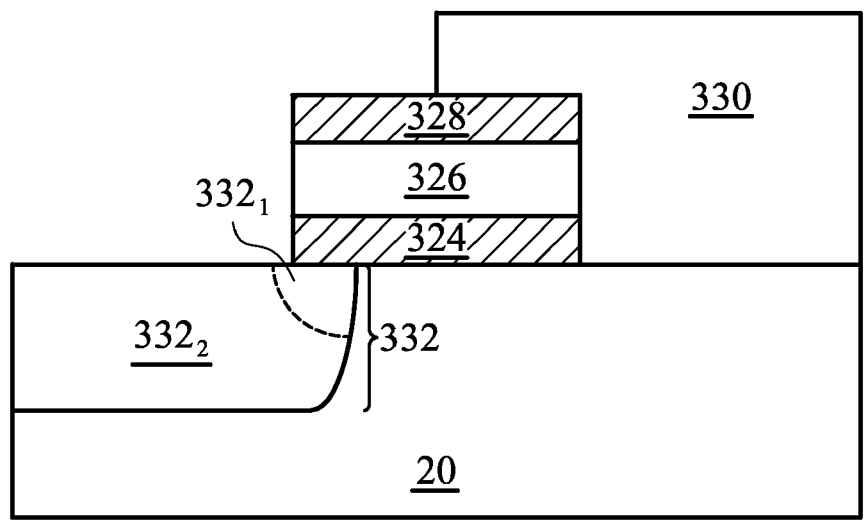
FIGS. 18 through 21 are cross-sectional views of intermediate stages in the manufacturing of a third embodiment of the present invention, wherein the source region has a lattice structure, while the channel region has a non-superlattice structure.

Referring to FIG. 18, a dummy gate stack, which includes dummy gate dielectric 324, dummy gate electrode 326, and dummy gate mask 328, is formed on substrate 20. Substrate 20 may be formed using similar materials, and has similar structures as discussed in the preceding paragraph, including, but not limited to, commonly used single-crystal semiconductor materials such as silicon, or compound semiconductor materials such as silicon germanium, silicon carbon, and/or the like. Dummy gate electrode 326 may be formed of polysilicon, metals, metal silicides, metal nitrides, and the like.

First, the source side of the structure as shown in FIG. 18 is masked, for example, by photo resist 330, and the drain side is doped to form drain region 332. In an embodiment, an n-type drain region 332 may include n or n+ drain extension region $332_1$ and n+ drain region $332_2$, whose formation details are provided in the discussion related to FIGS. 14 and 15. Similarly, a p-type drain region 332 may include p or p+ drain extension region $332_1$ and p+ drain region $332_2$. In alternative embodiments, no drain extension regions $332_1$ are formed, and drain region 332 may extend directly under dummy gate electrode 326, as shown in FIG. 18, or spaced apart from the respective edge of dummy gate electrode 326.

Figure 19:
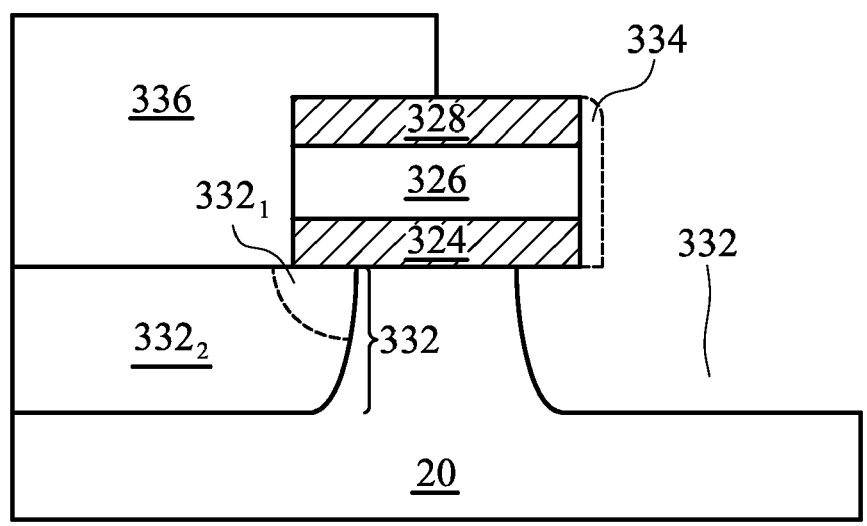
Figure 20A:
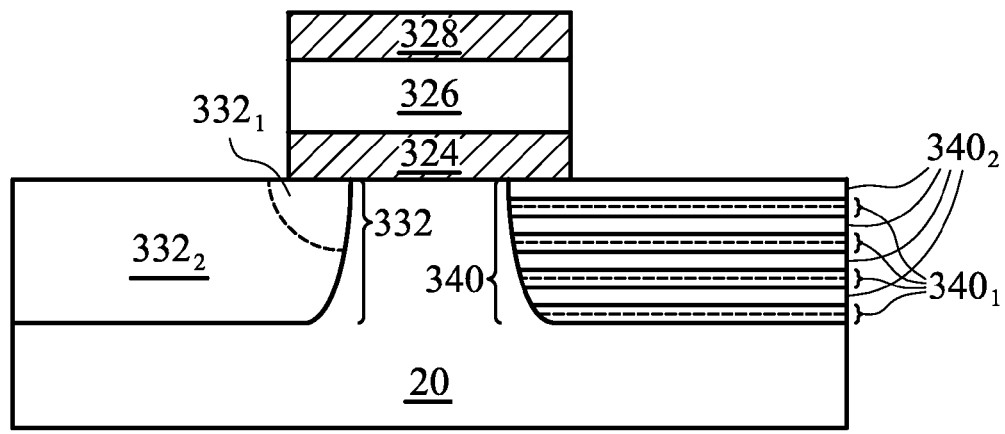

Referring to FIG. 19, mask 336 is formed to cover the drain side, while the source side is exposed. The exposed substrate 20 is then etched. Preferably, the etching is anisotropic with an isotropic component, so that recess 338 may extend directly under dummy gate electrode 326, although the recessing may also be substantially anisotropic or isotropic. When the recessing is anisotropic, the inner edge of the resulting recess 338 (and hence source region 340 as shown in FIGS. 20A through 21) is substantially vertically aligned with an edge of dummy gate electrode 326. Optionally, dummy gate spacer 334 may be formed to protect the sidewalls of dummy gate dielectric 324 and dummy gate electrode 326. The optional dummy spacer 334 may be removed before the formation of the formal gate spacers 342 (not shown in FIG. 19, refer to FIG. 21).

Figure 20B:
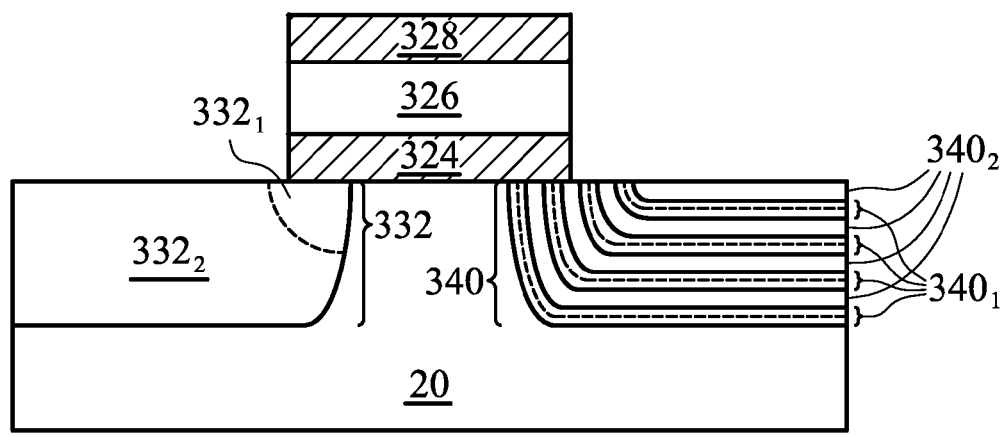
Figure 21:
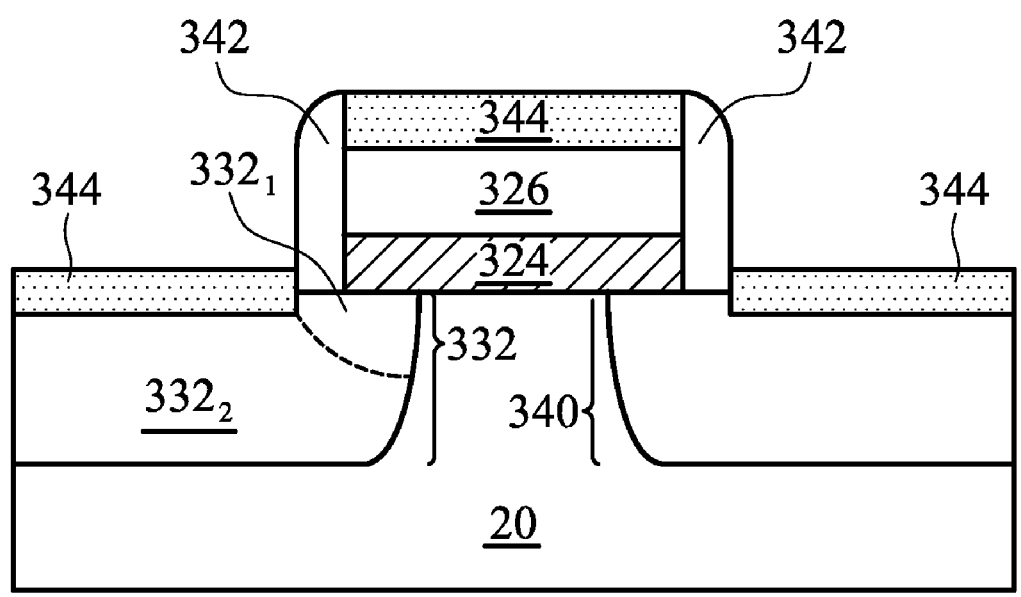

In FIGS. 20A and 20B, a selective epitaxial growth is performed to form superlattice source region 340. The structures and materials of the superlattice structure have been discussed in the preceding paragraphs, and hence are not repeated herein. In an embodiment, as shown in FIG. 20A, formation conditions are adjusted so that the base semiconductor layers $340_1$ and energy-band modifying layer(s) $340_2$ are substantially non-conformal. In alternative embodiments, as shown in FIG. 20B, formation conditions are adjusted so that the base semiconductor layers $340_1$ and energy-band modifying layer(s) $340_2$ are substantially conformal. Preferably, when the epitaxial growth proceeds, source region 340 is in-situ heavily doped with an impurity having a conductivity type opposite that of drain region 332. To maintain the superlattice structure, preferably, no source implantation is performed. When recess 338 (refer to FIG. 19) extends directly under dummy gate electrode 326, the respective source region 340 (and hence the superlattice structure) will have a portion directly under dummy gate electrode 326.

In FIG. 21, spacers 342 and silicide regions 344 are formed. The formation details are known in the art, and hence are not repeated herein. In the resulting tunnel FET device, the drain region has a non-superlattice semiconductor structure, while the source region has a superlattice structure. With the band offset provided by the structure as shown in FIG. 21, the device performance can be enhanced.

Figure 22:
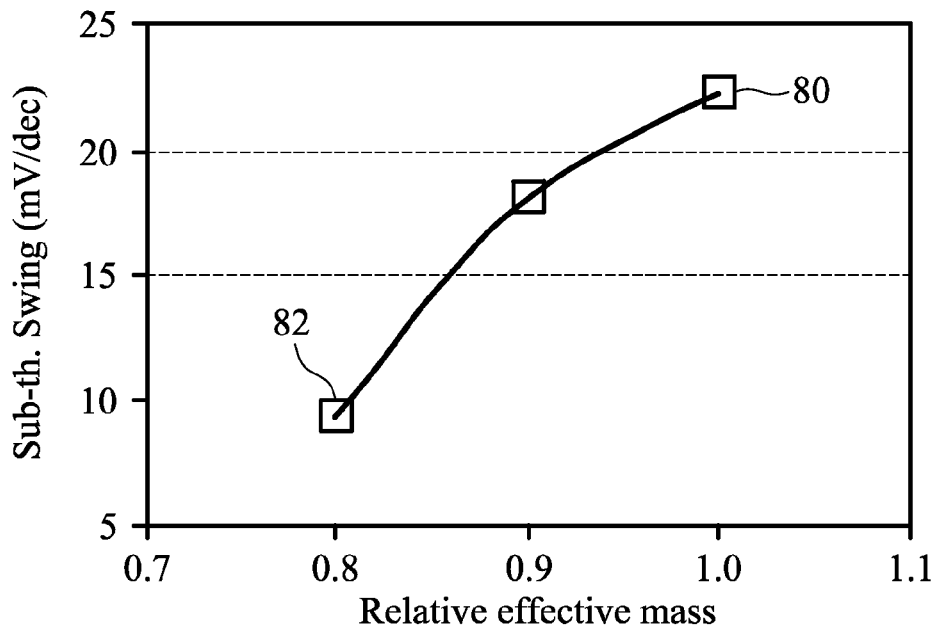
FIG. 22 shows simulation results revealing the relationship between the values of sub-threshold swing and the values of relative effective mass of carriers.

The embodiments of the present invention may provide unexpected results as to the reduction in sub-threshold swing, the increase in on-current, and the decrease in leakage current. FIG. 22 illustrates a simulation result, which reveals the relationship between the sub-threshold swing and the values of relative effective mass of carriers in the channel regions, wherein the values of relative effective mass are normalized to the effective mass of carriers in silicon. It is noted that in conventional tunnel FETs with silicon channels, the sub-threshold swing is about 22 mV/Dec (point 80), while by using the embodiments of the present invention, wherein the respective relative effective mass is reduced to 0.8 due to the superlattice channels, the sub threshold swing is reduced to less than about 10 mV/Dec (point 82), indicating significant improvement in the switching speed and in the on-current to off-current ratio.

Figure 23:
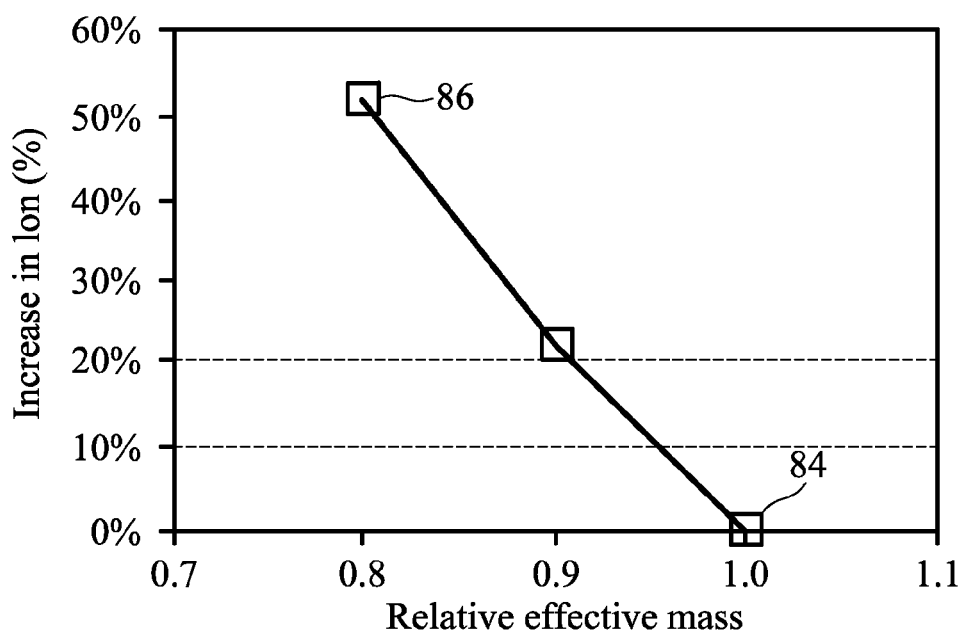
FIG. 23 illustrates percentages of the increase in on-currents as a function of relative effective mass of carriers.

The improvement in the on-current is shown in the simulation results shown in FIG. 23, which illustrates the percentage of the increase in on-currents as a function of the values of the relative effective mass. It is noted that the on-current (point 86) flowing between source and drain regions of the embodiment of the present invention is over 50 percent greater than the on-current (point 84) of the conventional tunnel FETs having silicon channel regions.

Figure 24:
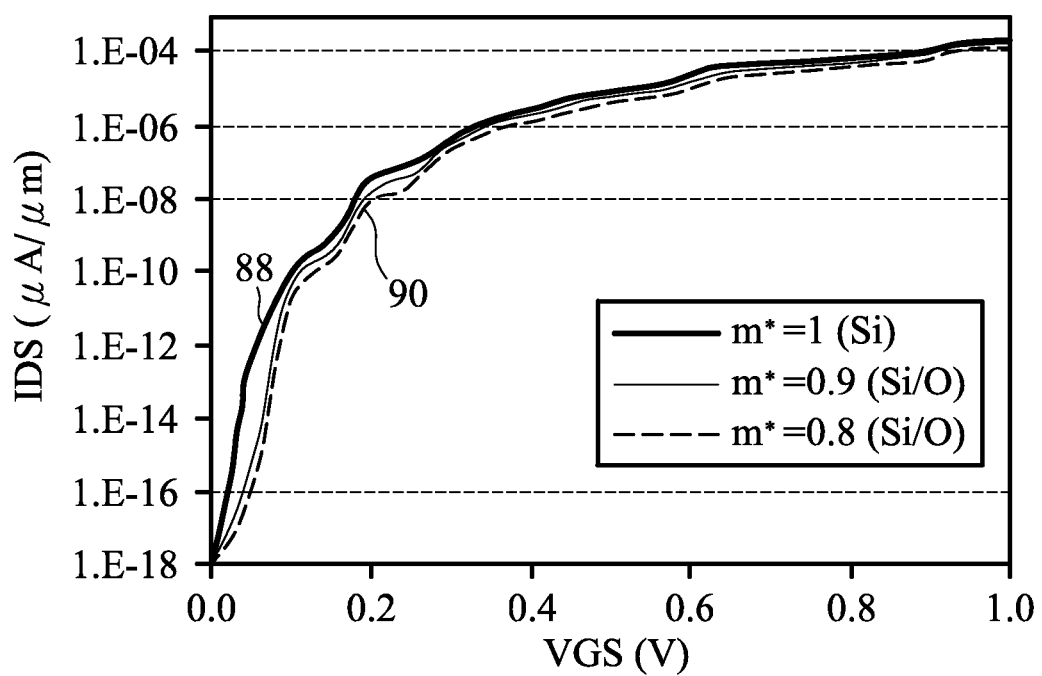
FIG. 24 illustrates I-V curves of tunnel FETs, which indicates that the tunneling effective mass is controlled by adopting superlattice channels.

FIG. 24 illustrates simulated I-V characteristics, wherein line 88 is obtained from the embodiments of the present invention, while line 90 is obtained from a conventional tunnel FET having a silicon channel. It is found that with the decreased relative effective mass, the current (line 88) of the embodiments of the present invention may be increased from about 1E-18 Amps (at 0V gate-to-source voltage (VGS)) to about 1E-10 Amps at 0.1V of VGS. As a comparison, the current (line 90) of conventional tunnel FETs may be increased from about 1E-18 Amps to close to 1E-11 Amps at 0.1V of VGS, which is significantly less than that of the embodiment of the present invention. Again, the results shown in FIG. 24 indicate significant improvement in the switching speed and in the on-current to off-current ratio.

Table 1 shows the simulated electrical performance of various FETs, including conventional (non-tunnel FET) MOSFETs, conventional MOSFETs with superlattice channel regions, conventional tunnel FETs, and the embodiments of the present invention.

Table 1 has proven that the tunnel FET devices having superlattice channels have significantly improved on/off current ratio, sub-threshold leakage, sub-threshold swing (RT swing), and ability to shrink the device over conventional FETs. Particularly, the combination of very low leakage current and high on-currents, which are difficult to obtain at the same time, is significantly better than conventional FETs. The improvement of the decrease in the leakage currents and the increase in on-currents at the same time may be attributed to the anisotropic band-structure modulation, which causes the decrease in the effective mass in the horizontal direction (parallel to the channel direction), and the increase in the effective mass in the vertical direction (perpendicular to the channel direction).

The embodiments of the present invention have several advantageous features. First, the tunnel FETs having superlattice channel regions break the conventional MOSFET sub-threshold swing limit, and thus can achieve very high on/off current ratios. Second, with the energy barriers formed of the energy-band modifying layers, the leakage currents are reduced due to the reduction in the gate leakage currents, as shown in Table 1. Third, the low on-current problem that was frequently observed in devices with low leakage currents is also solved. This significantly expands the usage of the embodiments of the present invention. For example, the embodiments of the present invention, with low leakage currents and a high on-off current ratio, is now well suitable for mobile applications, which require low power consumptions and high processing speeds.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are

TABLE 1

| Transistor Types | On/Off Current Ratio | Sub-Threshold Leakage | Gate Leakage | RT Swing (mV/Dec) | Mobility | Shrinkable (below 65 nm) | Cost |
|---|---|---|---|---|---|---|---|
| Conventional MOSFET | Medium | >nA/μm | High | ~100 | Low | Difficult | Low |
| Conventional MOSFET with Superlattice | High | >nA/μm | Low | ~100 | Low | Difficult | Medium |
| Tunnel FET without Superlattice | Low | <<nA/μm | High | <20 | N/A | Easy | Medium |
| Tunnel FET with Superlattice | High | <<nA/μm | Low | <20 | N/A | Easy | Medium |

What is claimed is:

1. A semiconductor device comprising:
a channel region;
a gate dielectric over the channel region;
a gate electrode over the gate dielectric;
a first source/drain region adjacent the gate dielectric, wherein the first source/drain region is of a first conductivity type, and wherein at least one of the channel region and the first source/drain region comprises a superlattice structure; and
a second source/drain region on an opposite side of the channel region than the first source/drain region, wherein the second source/drain region is of a second conductivity type opposite the first conductivity type, and wherein at most one of the first source/drain region and the second source/drain region comprises an additional superlattice structure.

2. The semiconductor device of claim 1, wherein the channel region comprises the superlattice structure, and the first source/drain region and the second source/drain region comprise non-superlattice structures.

3. The semiconductor device of claim 2, wherein the first source/drain region is heavily doped, and the second source/drain region is moderately doped.

4. The semiconductor device of claim 1, wherein the first source/drain region comprises the superlattice structure, and the channel region comprises a non-superlattice structure.

5. The semiconductor device of claim 4, wherein the superlattice structure comprises a portion directly underlying the gate electrode.

6. A semiconductor device comprising:
a superlattice channel region;
a gate dielectric over the superlattice channel region;
a gate electrode over the gate dielectric;
a first source/drain region adjacent the gate dielectric, wherein the first source/drain region is of a first conductivity type; and
a second source/drain region adjacent the gate dielectric, wherein the second source/drain region is of a second conductivity type opposite the first conductivity type, and wherein the superlattice channel region is between the first and the second source/drain regions.

7. The semiconductor device of claim 6, wherein the superlattice channel region is intrinsic.

8. The semiconductor device of claim 6, wherein the first source/drain region is heavily doped, and the second source/drain region is moderately doped.

9. The semiconductor device of claim 6, wherein the first and the second source/drain regions comprise same semiconductor materials as the superlattice channel region.

10. The semiconductor device of claim 6, wherein the first and the second source/drain regions comprise materials different from materials in the superlattice channel region.

11. The semiconductor device of claim 10 further comprising a first heavily doped source/drain extension region between the first source/drain region and the superlattice channel region, and a second heavily doped source/drain extension region between the second source/drain region and the superlattice channel region, wherein the first and the second heavily doped source/drain extension regions have depths substantially less than depths of the first and the second source/drain regions, respectively.

12. The semiconductor device of claim 6, wherein the superlattice channel region comprises a non-semiconductor monolayer sandwiched between base semiconductor layers.

13. The semiconductor device of claim 12, wherein the superlattice channel region further comprises an additional non-semiconductor monolayer bonded to the non-semiconductor monolayer.

14. The semiconductor device of claim 12, wherein the non-semiconductor monolayer comprises oxygen.

15. The semiconductor device of claim 6 further comprising a semiconductor substrate underlying the superlattice channel region, wherein the semiconductor substrate has a different structure from the superlattice channel region.

16. A semiconductor device comprising:
a semiconductor substrate;
a superlattice channel region over the semiconductor substrate, wherein the superlattice channel region comprises:
a first base semiconductor layer;
a second base semiconductor layer over the first base semiconductor layer; and
a non-semiconductor monolayer between the first and the second base semiconductor layers;
a gate dielectric over the superlattice channel region;
a gate electrode over the gate dielectric; and
a first and a second source/drain region on opposing sides of, and adjoining, the superlattice channel region, wherein the first and the second source/drain regions are of opposite conductivity types.

17. The semiconductor device of claim 16, wherein the first source/drain region is moderately doped, and wherein the second source/drain region is heavily doped.

18. The semiconductor device of claim 16, wherein the superlattice channel region further comprises:
a plurality of non-semiconductor monolayers; and
a plurality of semiconductor layers, wherein the plurality of non-semiconductor monolayers and the plurality of semiconductor layers are allocated in an alternating pattern.

19. The semiconductor device of claim 16, wherein the superlattice channel region comprises a material selected from the group consisting essentially of oxygen, nitrogen, fluorine, oxygen-carbon, and combinations thereof.

20. The semiconductor device of claim 16, wherein the superlattice channel region comprises a plurality of oxygen monolayers separated from each other by base semiconductor layers.

* * * * *